United States Patent
Lane et al.

(10) Patent No.: US 10,115,566 B2
(45) Date of Patent: *Oct. 30, 2018

(54) METHOD AND APPARATUS FOR CONTROLLING A MAGNETIC FIELD IN A PLASMA CHAMBER

(71) Applicant: APPLIED MATERIALS, INC., Santa Clara, CA (US)

(72) Inventors: Steven Lane, Porterville, CA (US); Tza-Jing Gung, San Jose, CA (US); Kartik Ramaswamy, San Jose, CA (US); Travis Koh, Sunnyvale, CA (US); Joseph F. Aubuchon, San Jose, CA (US); Yang Yang, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/437,757

(22) Filed: Feb. 21, 2017

(65) Prior Publication Data

US 2017/0162365 A1    Jun. 8, 2017

Related U.S. Application Data

(63) Continuation of application No. 14/339,990, filed on Jul. 24, 2014, now Pat. No. 9,613,783.

(51) Int. Cl.
*H01J 37/32* (2006.01)

(52) U.S. Cl.
CPC ..... *H01J 37/3211* (2013.01); *H01J 37/32669* (2013.01)

(58) Field of Classification Search
None
See application file for complete search history.

(56) References Cited

U.S. PATENT DOCUMENTS

| | | | | |
|---|---|---|---|---|
| 5,215,619 | A * | 6/1993 | Cheng | H01J 37/32477 |
| | | | | 118/724 |
| 6,015,476 | A * | 1/2000 | Schlueter | H01J 37/3266 |
| | | | | 118/723 E |
| 6,034,346 | A * | 3/2000 | Yoshioka | H01J 37/32192 |
| | | | | 118/723 MW |

(Continued)

OTHER PUBLICATIONS

Justin Dinale and Julian Vrbancich, "Generation of Long Prolate Volumes of Uniform Magnetic Field in Cylindrical Saddle Shaped Coils," Meas. Sci. Technol. 25, (2014) 035903 (13pp).

*Primary Examiner* — Douglas W Owens
*Assistant Examiner* — Srinivas Sathiraju
(74) *Attorney, Agent, or Firm* — Moser Taboada; Alan Taboada (57) ABSTRACT

Methods and apparatus for controlling a magnetic field in a plasma chamber are provided herein. In some embodiments, a process chamber liner may include a cylindrical body, an inner electromagnetic cosine-theta (cos θ) coil ring including a first plurality of inner coils embedded in the body and configured to generate a magnetic field in a first direction, and an outer electromagnetic cosine-theta (cos θ) coil ring including a second plurality of outer coils embedded in the body and configured to generate a magnetic field in a second direction orthogonal to the first direction, wherein the outer electromagnetic cos θ coil ring is disposed concentrically about the inner electromagnetic cos θ coil ring.

12 Claims, 5 Drawing Sheets

(56) References Cited

U.S. PATENT DOCUMENTS

| | | | | |
|---|---|---|---|---|
| 6,066,568 | A * | 5/2000 | Kawai | H01L 21/3065 438/707 |
| 6,103,074 | A * | 8/2000 | Khominich | C23C 14/228 204/192.38 |
| 6,172,321 | B1 * | 1/2001 | Yoshioka | H01J 37/32192 118/723 MR |
| 6,444,137 | B1 * | 9/2002 | Collins | C23C 16/402 216/67 |
| 6,518,195 | B1 * | 2/2003 | Collins | C23C 16/507 257/E21.252 |
| 6,824,363 | B2 * | 11/2004 | Mitrovic | F04B 17/00 417/48 |
| 6,910,440 | B2 * | 6/2005 | Ishii | 118/723 MW |
| 7,589,950 | B2 * | 9/2009 | Parkhe | H01L 21/6831 279/128 |
| 8,179,050 | B2 * | 5/2012 | Chen | H01J 37/32082 118/723 I |
| 8,871,064 | B2 * | 10/2014 | Gung | C23C 14/046 204/192.1 |
| 9,583,312 | B2 * | 2/2017 | Yamawaku | H01L 21/68764 |
| 9,613,783 | B2 * | 4/2017 | Lane | H01J 37/3211 |
| 9,779,953 | B2 * | 10/2017 | Aubuchon | H01L 21/3065 |
| 9,844,126 | B2 * | 12/2017 | Ikeda | H05H 1/46 |
| 2007/0267145 | A1 * | 11/2007 | Kitada | H01J 37/32431 156/345.51 |
| 2008/0296510 | A1 * | 12/2008 | Kasama | B82Y 10/00 250/423 R |
| 2012/0247679 | A1 * | 10/2012 | Yamazawa | H01J 37/321 156/345.48 |
| 2013/0105086 | A1 * | 5/2013 | Banna | H05H 1/46 156/345.38 |
| 2015/0294843 | A1 * | 10/2015 | Chen | H01J 37/32862 438/710 |
| 2016/0027613 | A1 * | 1/2016 | Lane | H01J 37/3211 315/34 |
| 2017/0162365 | A1 * | 6/2017 | Lane | H01J 37/3211 |

* cited by examiner

METHOD AND APPARATUS FOR CONTROLLING A MAGNETIC FIELD IN A PLASMA CHAMBER

CROSS-REFERENCE

This application is a continuation of co-pending U.S. patent application Ser. No. 14/339,990, filed Jul. 24, 2014, which is herein incorporated by reference.

FIELD

Embodiments of the present disclosure generally relate to plasma enhanced semiconductor substrate processing.

BACKGROUND

Some semiconductor wafer processing chambers are of a type in which a magnetic field is produced within the reaction chamber by providing a plurality of electromagnets around the reaction chamber to accelerate formation of the plasma. These chambers use magnetic fields to manipulate plasma density through electron cyclotron rotation.

However, the inventors have observed that the intensity of the magnetic field tends to be greater on the edge of a substrate placed in the reaction chamber than in the center of the wafer. Therefore, when this method of producing a magnetic field is applied to a plasma etching chamber, there is a problem that the etch rate and the selectivity are not uniform over the substrate surface. When the method is applied to a chemical vapor deposition (CVD) chamber, there is a problem of non-uniformity in the film formation upon the substrate surface. Still another problem is that the electrical components formed on the substrate may suffer charging damage due to a non-uniform plasma density.

Therefore, the inventors have provided an improved method and apparatus for controlling a magnetic field in a semiconductor wafer processing chamber.

SUMMARY

Methods and apparatus for controlling a magnetic field in a plasma chamber are provided herein. In some embodiments, a process chamber liner may include a cylindrical body, an inner electromagnetic cosine-theta (cos θ) coil ring including a first plurality of inner coils embedded in the body and configured to generate a magnetic field in a first direction, and an outer electromagnetic cosine-theta (cos θ) coil ring including a second plurality of outer coils embedded in the body and configured to generate a magnetic field in a second direction orthogonal to the first direction, wherein the outer electromagnetic cos θ coil ring is disposed concentrically about the inner electromagnetic cos θ coil ring.

In some embodiments, a method for controlling a magnetic field in a plasma chamber includes generating a plasma in the plasma chamber having an internal processing volume, providing current to at least one of an inner electromagnetic cosine-theta (cos θ) coil ring or an outer electromagnetic cosine-theta (cos θ) coil ring disposed in the plasma chamber to generate a constant transverse B-field, adjusting at least one of a magnitude or a direction of the current provided to at least one of the inner electromagnetic cos θ coil ring or the outer electromagnetic cos θ coil ring to control a direction and a magnitude of the constant transverse B field generated, and adjusting a uniformity of the plasma generated by controlling the direction and magnitude of the constant transverse B-field.

In some embodiments, an apparatus for processing a substrate may include a process chamber having an internal processing volume, a substrate support disposed in the process chamber to support a substrate when disposed therein, an inner electromagnetic cosine-theta (cos θ) coil ring including a first plurality of inner coils configured to generate a magnetic field in a first direction, and an outer electromagnetic cosine-theta (cos θ) coil ring including a second plurality of outer coils configured to generate a magnetic field in a second direction orthogonal to the first direction, wherein the outer electromagnetic cos θ coil ring is disposed concentrically about the inner electromagnetic cos θ coil ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure may advantageously reduce, control, or eliminate skew on a substrate that is induced by magnetic fields used in industrial plasma etch reactors. Skew generally refers to the difference in process results from one region of the substrate to another, such as left vs. right, center vs. edge, top vs. bottom of a feature, or the like (e.g., skew refers to the pattern of non-uniformity on the substrate). Skew in the substrate uniformity could also be related to, or otherwise caused by, the previous chamber used to process the substrate in the process sequence, the flow or pump or thermal asymmetries, or asymmetrical power delivery by the RF power applicator that generates plasma. Skew can be used to characterize process results such as critical dimension (CD) uniformity, etch depth uniformity, or other process results. The application as written seems to suggest a prior magnetic field that introduces skew and the cosine theta coil seems to corrective inventors have observed that a large volume field programmable constant transverse B-field is one way to influence plasma uniformity and direction. Thus, a method to generate and control the magnitude and direction of a constant transverse B-field in a plasma chamber is provided to manipulate plasma uniformity and direction to correct for skews. More specifically, a method to generate and control a field programmable "cosine-theta" (cos θ) coil system in an embedded liner of a substrate process chamber is provided herein to advantageously correct for skew.

Figure 1:
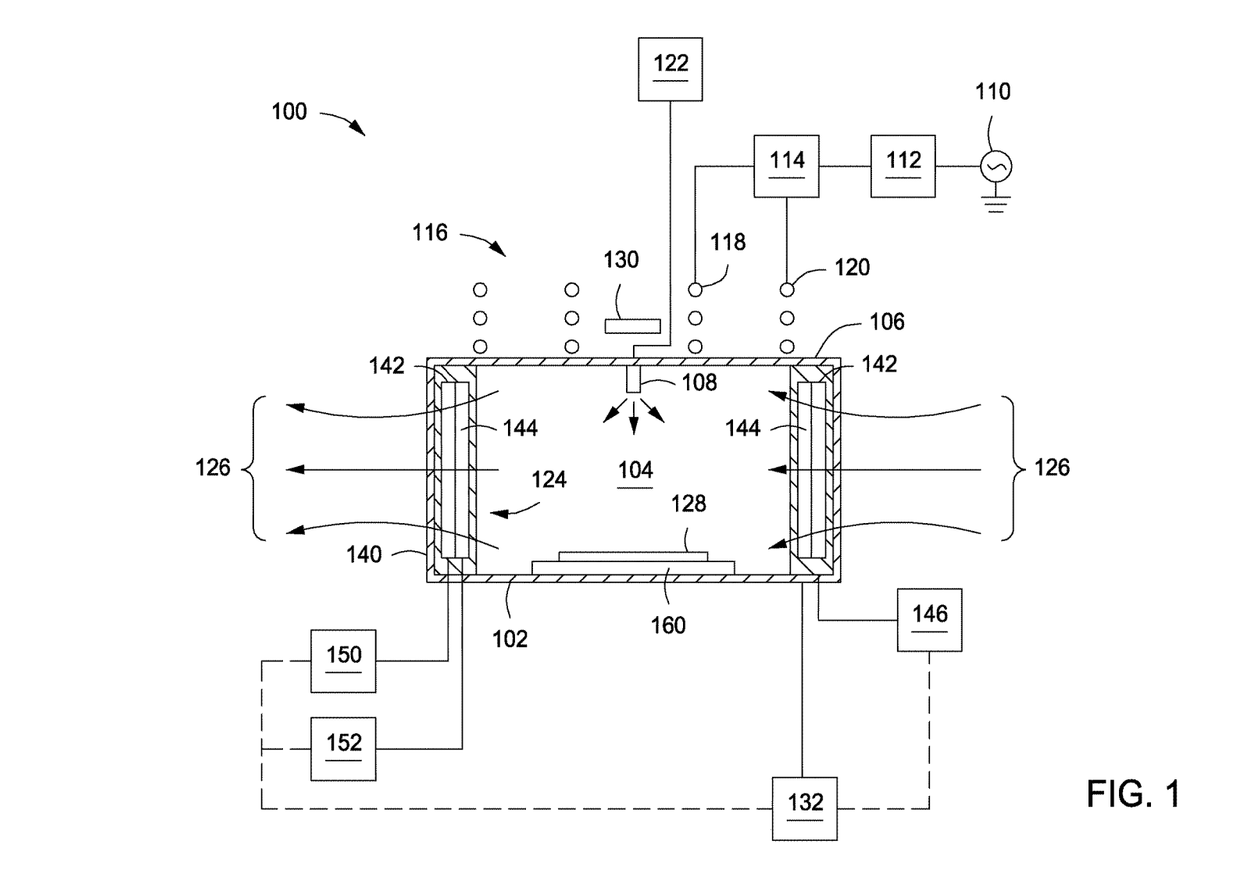
FIG. 1 depicts a schematic side view of an inductively coupled plasma reactor in accordance with some embodiments of the present disclosure.

FIG. 1 depicts a schematic side view of an inductively coupled plasma reactor 100 (ICP reactor) suitable for performing embodiments of the present disclosure. The ICP reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present disclosure include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings. For example, suitable exemplary plasma reactors that may be utilized with the inventive methods disclosed herein are further described in U.S. patent application Ser. No. 12/821,609, filed Jun. 23, 2010 by V. Todorow, et al., and entitled, "INDUCTIVELY COUPLED PLASMA APPARATUS," or U.S. patent application Ser. No. 12/821,636, filed Jun. 23, 2010 by S. Banna, et al., and entitled, "DUAL MODE INDUCTIVELY COUPLED PLASMA REACTOR WITH ADJUSTABLE PHASE COIL ASSEMBLY."

The reactor 100 generally includes the process chamber 102 having a conductive body (wall) with chamber liner 140, and a dielectric lid 106 (that together define a processing volume 104), a substrate support pedestal 160 disposed within the processing volume to support a substrate 128, an inductive plasma source 116, and a controller 132. In some embodiments, the dielectric lid 106 may be substantially flat. Other modifications of the process chamber 102 may have other types of lids such as, for example, a dome-shaped lid or other shapes. The inductive plasma source 116 is typically disposed above the lid 106 and is configured to inductively couple RF power into the process chamber 102.

The inductive plasma source 116 is disposed atop the process chamber 102. The inductive plasma source includes an RF feed structure for coupling an RF power supply 110 to a plurality of RF coils, e.g., a first RF coil 118 and a second RF coil 120. The plurality of RF coils are coaxially disposed proximate the process chamber 102 (for example, above the lid 106 of the process chamber 102) and are configured to inductively couple RF power into the process chamber 102 to form or control a plasma from process gases provided within the process chamber 102 (for example, via a gas source 122 coupled to a gas inlet 108, such as a showerhead or nozzle or the like). The relative position, ratio of diameters of each coil, and/or the number of turns in each coil can each be adjusted as desired to control, for example, the profile or density of the plasma being formed via controlling the inductance on each coil.

The RF power supply 110 is coupled to the RF feed structure via a match network 112. A power divider 114 may be provided to adjust the RF power respectively delivered to the first and second RF coils 118, 120. The power divider 114 may be coupled between the match network 112 and the RF feed structure. Alternatively, the power divider may be a part of the match network 112, in which case the match network will have two outputs coupled to the RF feed structure—one corresponding to each RF coil 118, 120. The RF power supply 110 may illustratively be capable of producing up to about 4000 W (but not limited to about 4000 W) at a tunable frequency in a range from 50 kHz to 13.56 MHz, although other frequencies and powers may be provided as desired for particular applications.

The controller 132 comprises a central processing unit (CPU), a memory, and support circuits for the CPU and facilitates control of the components of the reactor 100 and, as such, of methods of processing a substrate, such as discussed herein. The controller 132 may be one of any form of general-purpose computer processor that can be used in an industrial setting for controlling various chambers and sub-processors. The memory, or computer-readable medium, of the CPU may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits include cache, power supplies, clock circuits, input/output circuitry and subsystems, and the like. The memory stores software (source or object code) that may be executed or invoked to control the operation of the reactor 100 in the manner described below. Specifically, memory stores one or more embodiments of the methods disclosed herein, such as the method 400 discussed above. The software routine may also be stored and/or executed by a second CPU (not shown) that is remotely located from the hardware being controlled by the CPU.

A plurality of electromagnets 124 are provided to form a desired magnetic field within the inner volume, or processing volume 104, of the process chamber 102 (e.g., as represented by magnetic field lines 126) at least at the substrate level 128, or in some embodiments, within the entire processing volume 104 above the substrate. One or more magnetic field sensors 130 may be provided to measure the magnitude and direction of the magnetic field as discussed above.

In some embodiments, the plurality of electromagnets 124 may be disposed within a wall of process chamber 102 or within liner 140 disposed within the process chamber 102. In some embodiments, the liner 140 may be grounded such that the plurality of electromagnets 124 embedded within liner 140 have little to no impact on the RF return currents induced by RF power supply 110. The liner 140 may be made of a conductive metal or other conductive material. For example, in some embodiments, the liner 140 may be formed from an aluminum alloy. The plurality of electromagnets 124 may be electrically insulated from the conductive liner. In some embodiments, the liner may be made from a non-conductive composite material. The liner 140 may be a double walled liner having an inner wall and an outer wall. In some embodiments, one of the inner or outer walls may be formed from a non-conductive material and include the plurality of electromagnets 124 embedded within the wall, while the other wall is made from a conductive metal material that is ground. In some embodiments, the liner 140 may be temperature controlled. For example, a heater 146 may be coupled to liner 140. The heater 146 may be controlled by controller 132.

The plurality of electromagnets 124 may include an outer ring of electromagnetic coils 142 and an inner ring of electromagnet coils 144. The outer and inner rings of coils 142, 144 may be disposed concentrically and coaxially with respect to one another. The outer and inner rings of coils 142, 144 may be embedded in the process chamber liner 140. In some embodiments, one or more deep circular grooves may be formed in the top or bottom surface of the liner 140, and the outer and inner rings of coils 142, 144 may be disposed within the circular groove.

In some embodiments where the liner 140 is a double walled liner, the outer coil 142 may be disposed in an outer wall of the liner 140 while the inner coil 144 is disposed in an inner wall of the liner 140. In other embodiments where the liner 140 is a double walled liner, both the outer coil 142 and inner coil 144 may be disposed in an outer or inner wall of the liner 140 formed of non-conductive material.

Each of the outer and inner rings of electromagnetic coils 142, 144 may be coupled to a separate DC power supplies 150, 152 that are independently controlled by controller 132. In some embodiments, each of the outer and inner rings of electromagnetic coils 142, 144 may be coupled to the same power supply. In some embodiments, the DC power supplies 150, 152 are coupled to coils 142, 144 via stationary electric contacts since the constant transverse B-field produced may be rotated non-mechanically as described below.

Figure 2A:
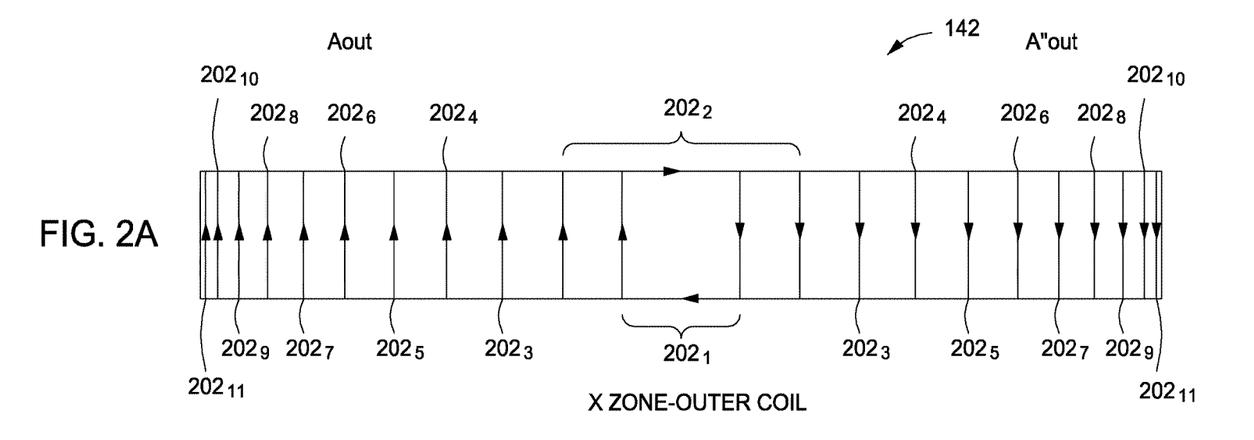
FIGS. 2A-B depict schematic side views of electromagnet coil configurations in accordance with some embodiments of the present disclosure.
Figure 2B:
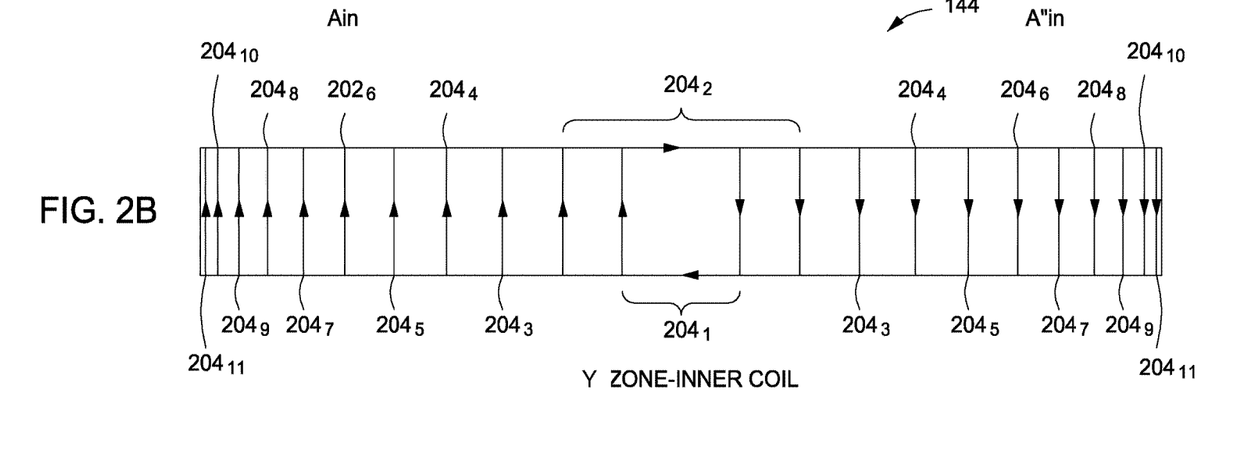

In some embodiments, each of the outer and inner rings of electromagnetic coils 142, 144 are "cosine-theta" (cos $\theta$) coils that each include a plurality of sets of coils. Each cos $\theta$ coil 142, 144 consists of two sets cos $\theta$ windings disposed opposite each other to generate radial fields. For example, FIG. 2A shows a side view of the outer cos $\theta$ coil 142 that depicts a first set of 11 cos $\theta$ outer coils/windings $202_1$-$202_{11}$. A second set of cos $\theta$ outer coils/windings $202'_1$-$202'_{11}$ disposed opposite the first set of coils can be seen in the top down view of the outer cos $\theta$ coil 142 in FIGS. 3A and 3B. Similarly, FIG. 2B shows a side view of the inner cos $\theta$ coil 144 that depicts a first set of 11 inner coils $204_1$-$204_{11}$. A second set of orthogonal cos $\theta$ inner windings $204'_1$-$204'_{11}$ can be seen in the top down view of the outer cos $\theta$ coil 144 in FIG. 3A. The shape formed by each coil $202_1$-$202_{11}$, $202'_1$-$202'_{11}$, $204_1$-$204_{11}$, and $204'_1$-$204'_{11}$ is a saddle shape as shown in FIG. 3B. In some embodiments, the number of sets/pairs of coils in each cos $\theta$ coil 142, 144 may be from 2 sets/pairs of coils (4 coils total) to about 50 sets/pairs of coils (100 coils total).

Figure 3A:
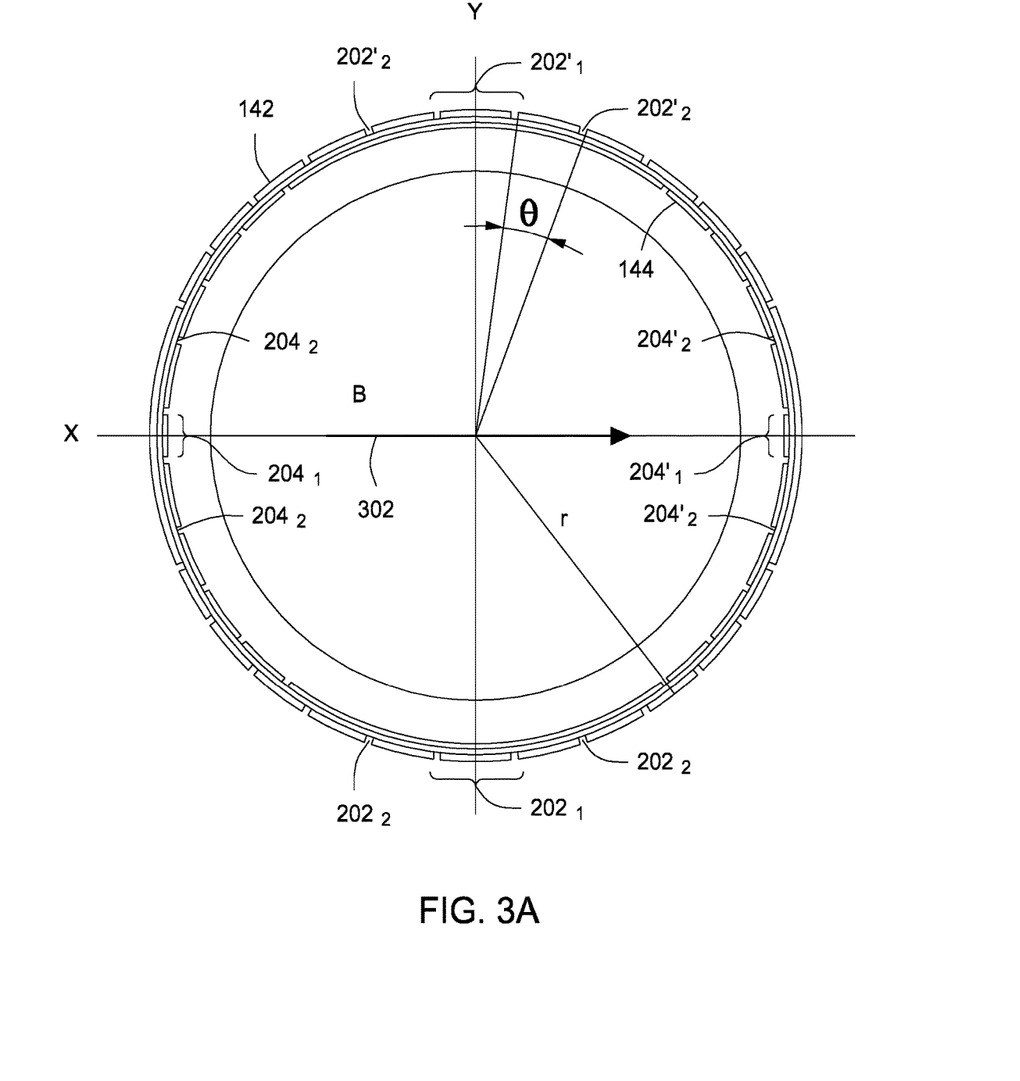
FIG. 3A depicts a top view of electromagnet coil configurations in accordance with some embodiments of the present disclosure.
Figure 3B:
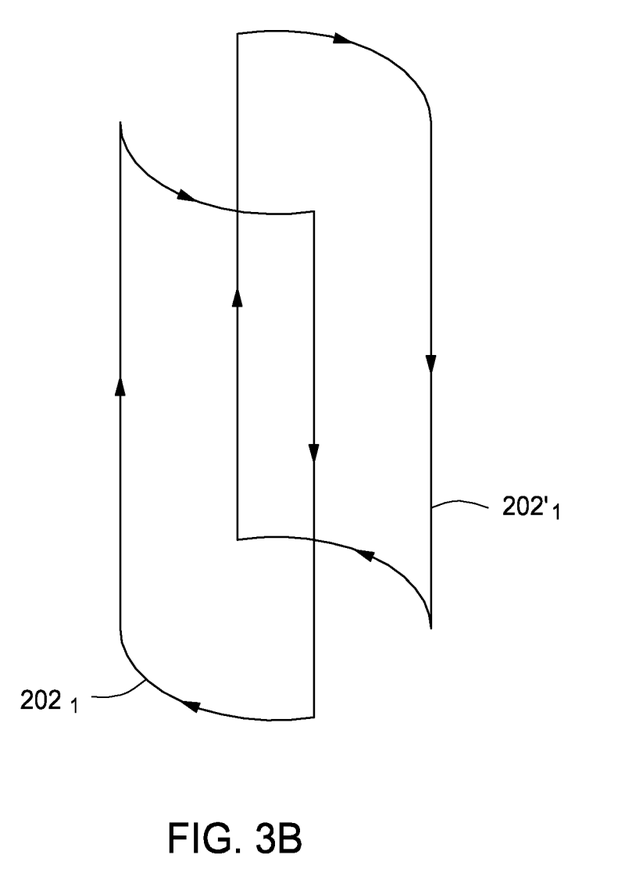
FIG. 3B depicts an isometric view of an exemplary electromagnet coil pair having a saddle-shape in accordance with some embodiments of the present disclosure.

As shown in FIG. 3A, each cos $\theta$ coil 142, 144 includes series of saddle-shaped coils spaced uniformly with respect to cos $\theta$ on the curved cylindrical surface, where $\theta$ is the angle between the radius of the cylinder and the radial axis. Each cos $\theta$ coil 142, 144 consists of $N_{cp}$ coil pairs spaced uniformly with respect to cos $\theta$ on the curved surface of a cylinder whose base is in the xy-plane and length is along the x-axis, such that y=r cos $\theta$. The number of turns/windings in each coil increases as $\theta$ increases to produce the cos $\theta$ coil. For example, in some embodiments, the coils may include the following number of turns to produce a cos $\theta$ distribution:

coils $202_1$, $202'_1$, $204_1$, and $204'_1$=3 turns
coils $202_2$, $202'_2$, $204_2$, and $204'_2$=5 turns
coils $202_3$, $202'_3$, $204_3$, and $204'_3$=8 turns
coils $202_4$, $202'_4$, $204_4$, and $204'_4$=10 turns
coils $202_5$, $202'_5$, $204_5$, and $204'_5$=13 turns
coils $202_6$, $202'_6$, $204_6$, and $204'_6$=15 turns
coils $202_7$, $202'_7$, $204_7$, and $204'_7$=16 turns
coils $202_5$, $202'_5$, $204_8$, and $204'_8$=18 turns
coils $202_9$, $202'_9$, $204_9$, and $204'_9$=19 turns
coils $202_{10}$, $202'_{10}$, $204_{10}$, and $204'_{10}$=20 turns
coils $202_{11}$, $202'_{11}$, $204_{11}$, and $204'_{11}$=20 turns Although the above example shows that the structure of the cos $\theta$ distribution of the outer coil 142 and the inner coil 144 are the same, in some embodiments the cos $\theta$ distribution between the outer coil 142 and the inner coil 144 may be different (i.e., the outer coil 142 and the inner coil 144 may have different spacing between coils, different number of sets of coils, and/or a different number of turns per coil.) In some embodiments, the number of turns for each coil included in the outer coil 142 and the inner coil 144 are the same, but the position of the windings may disposed such that the desired cos $\theta$ distribution is achieved.

Each coil in the outer cos $\theta$ coil 142 has the same current passing through each coil turn. Similarly, each coil in the inner cos $\theta$ coil 144 has the same current passing through each coil turn. At the extremities of the coil the current travels along the curved boundary of the circular base of the cylinder, in the xy-plane. In some embodiments, as shown in FIG. 3A, the X-Plane cos $\theta$ outer coil 142 is rotated 90 degrees from the Y-Plane cos $\theta$ inner coil 144 (i.e., the outer coil 142 and the inner coil 144 are disposed orthogonally to one another). Thus, the outer coil 142 can produce a constant transverse B-field in an X-direction, for example, while the inner coil 144 can produce a constant transverse B-field in a Y-direction. The interaction of the B-fields produce a single constant transverse B-field that can be controlled (i.e., magnitude and direction can be altered).

By providing power/current to at least one of the cos $\theta$ coils 142, 144, a constant transverse B-field 302 (i.e., magnetic field) may be produced in a plane substantially parallel to the surface of the substrate 128. A magnetic field is the magnetic influence of electric currents and magnetic materials. The magnetic field at any given point is specified by both a direction and a magnitude/strength and denoted as a vector B field measured in units of amp per meter. The B field is most commonly defined in terms of the Lorentz force it exerts on moving electric charges.

The inventors have observed that by controlling the magnitude and direction of the current supplied to each cos $\theta$ coil 142, 144, that the magnitude and direction of a constant transverse B-field 302 may be controlled. The inventors have further observed that by adjusting/controlling the magnitude and direction of a constant transverse B-field 302 in a plasma chamber, plasma uniformity and direction can be advantageously manipulated to correct for skew as described below with respect to FIG. 4.

Figure 4:
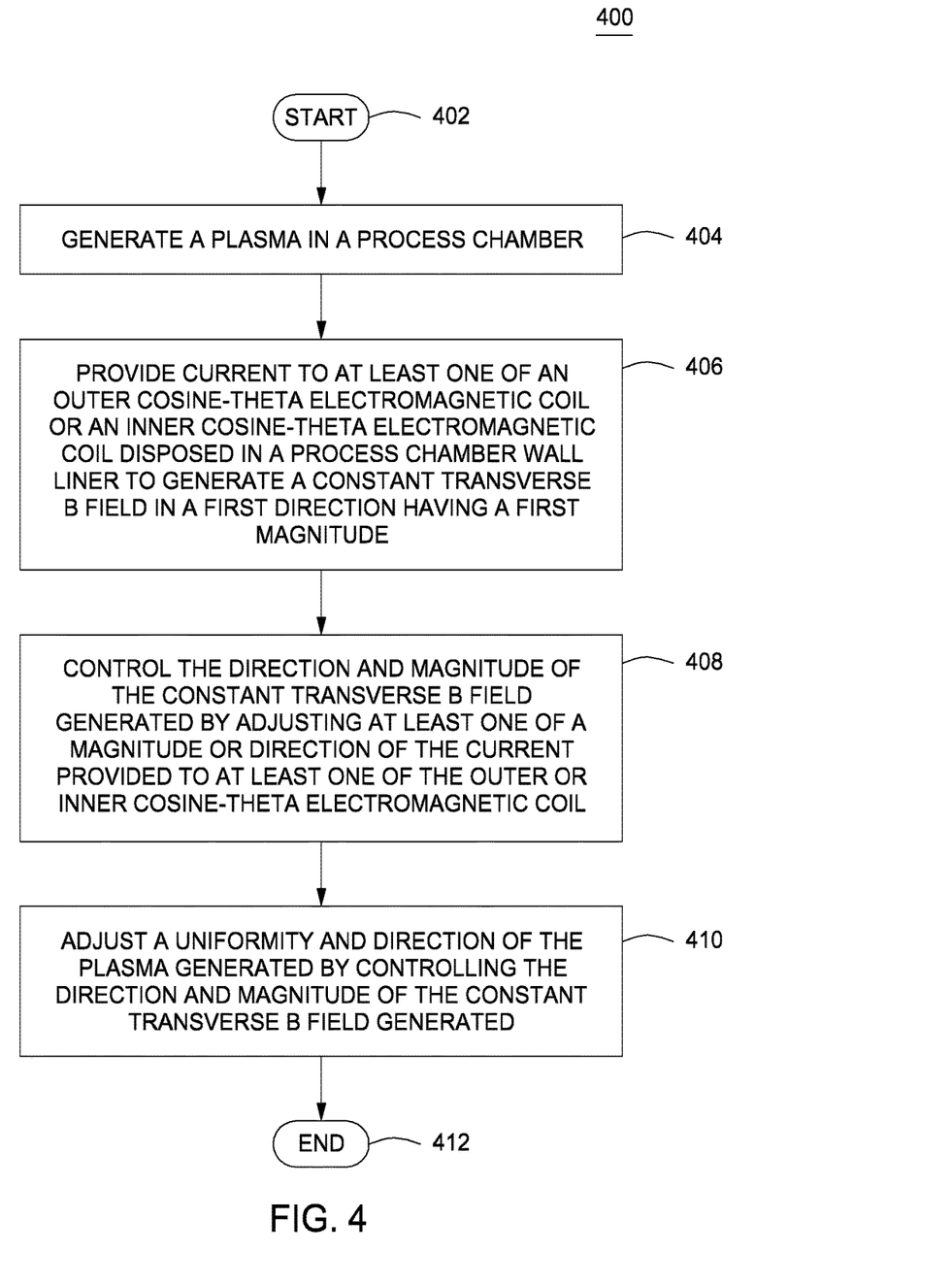
FIG. 4 depicts a flow chart of a method for controlling a magnetic field in a plasma chamber in accordance with some embodiments of the present disclosure.

FIG. 4 depicts a method 400 for controlling a magnetic field in a plasma chamber. More specifically, FIG. 4 depicts a method 400 for controlling a constant transverse B-field 302 in a plasma chamber to correct for substrate surface skew. The method 400 begins at 402 and proceeds to 404 where a plasma is generated in the process chamber (for example, process chamber 102). At 406, the current is provided to at least one of the outer cosine theta coil 142 or the inner cos $\theta$ coil 144 which is disposed in-line or 140. The current may be supplied by DC power supplies 150 and/or 152. In the current is provided to coils 142 and/or 144 a constant transverse B-field 302 is generated. The constant transverse B-field 302 generated will have a first direction and a first magnitude. In some embodiments, the current is provided both the outer coil 142 and the inner coil 144. In other embodiments the current may be provided to only one of the outer coil 142 or the inner coil 144 to generate a magnetic field across the surface of the substrate 128. The magnitude and direction of the current supplied by power supplies 150, 152 may be controlled by controller 132.

In some embodiments, the liner 140 may be heated by heater 146 to a desired temperature, before or after the current is provided to coils 142, 144 by power supplies 150, 152. The liner may be heated to a temperature of about 18° C. to about 150° C. Heating the liner 140 advantageously reduces material (e.g., polymer) deposition on the liner wall during substrate processing that utilize gases that are polymerizing gas. Thus, heating the liner 140 advantageously reduces process chamber contamination and chamber cleaning time. Also, when heating the liner 140 advantageously matches the temperature of the liner 140 with other parts of chamber, such as a showerhead or ceramic lead, to reduce temperature variation inside the chamber.

At 408 the direction and magnitude of the constant transverse B-field 302 is controlled by adjusting at least one of the magnitude or direction of the current provided to either or both of the outer or inner coils 142, 144. By changing the magnitude and direction of the current provided to coils 142, 144, the constant transverse B-field 302 may be rotated 360° in any direction in a plane parallel to the surface of substrate 128. In some embodiments, changing the direction of the current includes changing the polarity of the current supplied to the coils 142, 144. Thus, the constant transverse B-field may be rotated without any mechanical movement of the substrate 128, a substrate support which supports the substrate, the RF coils (e.g., 118, 120), or the electromagnetic coils (e.g., 142, 144). For example, the outer 142 $c$ can be driven by a sinusoidal current form and the inner coil can be driven by the same sinusoidal current but with a phase delay. The relative phase delay can be adjusted/controlled to generate desired B-field direction.

At 410, uniformity and direction of the plasma generated can be adjusted by controlling the direction the magnitude of the constant transverse B-field generated. The method 400 ends at 412.

While the foregoing is directed to embodiments of the present disclosure, other and further embodiments of the disclosure may be devised without departing from the basic scope thereof.

The invention claimed is:

1. An electromagnetic cosine-theta (cos θ) coil ring assembly for use in a process, comprising:
   a cylindrical body;
   an inner electromagnetic cosine-theta (cos θ) coil ring including a first plurality of inner coils disposed about an inner surface of the cylindrical body and configured to generate a magnetic field in a first direction; and
   an outer electromagnetic cosine-theta (cos θ) coil ring including a second plurality of outer coils disposed about an outer surface of the cylindrical body and configured to generate a magnetic field in a second direction different from the first direction, wherein the outer electromagnetic cos θ coil ring is disposed concentrically about the inner electromagnetic cos θ coil ring.

2. The electromagnetic cosine-theta (cos θ) coil ring assembly of claim 1, wherein the cylindrical body is electrically grounded.

3. The electromagnetic cosine-theta (cos θ) coil ring assembly of claim 1, wherein the cylindrical body is fabricated from a conductive metal material.

4. The electromagnetic cosine-theta (cos θ) coil ring assembly of claim 1, wherein the cylindrical body is fabricated from a non-conductive material.

5. The electromagnetic cosine-theta (cos θ) coil ring assembly of claim 1, wherein the first plurality of inner coils includes a first set of inner cos θ coils, and a second set of inner cos θ coils disposed on an opposite side of the first set of inner cos θ coils.

6. The electromagnetic cosine-theta (cos θ) coil ring assembly of claim 5, wherein each of the first plurality of inner coils has a saddle coil shape.

7. The electromagnetic cosine-theta (cos θ) coil ring assembly of claim 1, wherein the second plurality of outer coils includes a first set of outer cos θ coils, and a second set of outer cos θ coils disposed on an opposite side of the first set of outer cos θ coils.

8. The electromagnetic cosine-theta (cos θ) coil ring assembly of claim 7, wherein each of the second plurality of outer coils has a saddle coil shape.

9. The electromagnetic cosine-theta (cos θ) coil ring assembly of claim 1, wherein the inner electromagnetic cos θ coil ring and the outer electromagnetic cos θ coil ring are configured to generate a constant transverse B-field.

10. An apparatus for processing a substrate, comprising:
    a process chamber having an internal processing volume;
    a substrate support disposed in the process chamber to support a substrate when disposed thereon; and
    an electromagnetic cosine-theta (cos θ) coil ring assembly configured to generate a constant transverse B-field in a plane substantially parallel to a processing surface of the substrate, wherein the electromagnetic cosine-theta (cos θ) coil ring assembly comprises:
    an inner electromagnetic cosine-theta (cos θ) coil ring including a first plurality of inner coils configured to generate a magnetic field in a first direction; and
    an outer electromagnetic cosine-theta (cos θ) coil ring including a second plurality of outer coils configured to generate a magnetic field in a second direction different from the first direction, wherein the outer electromagnetic cos θ coil ring is disposed concentrically about the inner electromagnetic cos θ coil ring.

11. The apparatus of claim 10, further comprising:
    a first power supply coupled to the inner electromagnetic cos θ coil ring configured to supply a first current to the first plurality of inner coils;
    a second power supply coupled to the outer electromagnetic cos θ coil ring configured to supply a second current to the second plurality of outer coils; and
    a controller communicatively coupled to the first and second power supplies, wherein the controller is configured to adjust at least one of magnitude or a direction of at least one of the first or second currents to control a magnitude and direction of a constant transverse B-field produced by the inner electromagnetic cos θ coil ring and the outer electromagnetic cos θ coil ring.

12. The apparatus of claim 11, wherein the inner electromagnetic cos θ coil ring and the outer electromagnetic cos θ coil ring are configured to generate a constant transverse B-field.

* * * * *